United States Patent
Yu et al.

(10) Patent No.: US 9,806,038 B2
(45) Date of Patent: Oct. 31, 2017

(54) REINFORCEMENT STRUCTURE AND METHOD FOR CONTROLLING WARPAGE OF CHIP MOUNTED ON SUBSTRATE

(71) Applicant: Taiwan Semiconductor Manufacturing Company, Ltd., Hsin-Chu (TW)

(72) Inventors: Chen-Hua Yu, Hsin-Chu (TW);
Shang-Yun Hou, Jubei (TW);
Cheng-Chieh Hsieh, Tainan (TW);
Tsung-Shu Lin, New Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 15/202,462

(22) Filed: Jul. 5, 2016

(65) Prior Publication Data
US 2016/0315057 A1    Oct. 27, 2016

Related U.S. Application Data

(62) Division of application No. 13/791,411, filed on Mar. 8, 2013, now Pat. No. 9,385,091.

(51) Int. Cl.
| | |
|---|---|
| *H01L 23/00* | (2006.01) |
| *H01L 23/58* | (2006.01) |
| *H01L 21/50* | (2006.01) |
| *H01L 23/31* | (2006.01) |
| *H01L 23/492* | (2006.01) |
| *H01L 23/29* | (2006.01) |

(52) U.S. Cl.
CPC ............ *H01L 23/585* (2013.01); *H01L 21/50* (2013.01); *H01L 23/3142* (2013.01); *H01L 23/4924* (2013.01); *H01L 23/562* (2013.01); *H01L 23/291* (2013.01); *H01L 2924/0002* (2013.01)

(58) Field of Classification Search
CPC .................................................. H01L 23/3142
See application file for complete search history.

(56) References Cited

U.S. PATENT DOCUMENTS

| | | | | |
|---|---|---|---|---|
| 5,397,921 | A | * | 3/1995 | Karnezos ............ H01L 23/3128 257/698 |
| 5,841,194 | A | | 11/1998 | Tsukamoto |
| 6,014,317 | A | | 1/2000 | Sylvester |
| 2002/0197771 | A1 | * | 12/2002 | Dotta .................... H01L 21/563 438/114 |
| 2003/0030140 | A1 | | 2/2003 | Shim |
| 2006/0043548 | A1 | | 3/2006 | Kanda et al. |
| 2007/0216034 | A1 | * | 9/2007 | Bachman .............. H01L 21/563 257/778 |
| 2008/0054490 | A1 | | 3/2008 | McLellan et al. |
| 2008/0237840 | A1 | | 10/2008 | Alcoe et al. |
| 2009/0200659 | A1 | | 8/2009 | Tosaya et al. |

(Continued)

FOREIGN PATENT DOCUMENTS

| | | |
|---|---|---|
| TW | 275139 | 5/1996 |
| TW | 200845316 | 11/2008 |
| TW | 201301451 A | 1/2013 |

*Primary Examiner* — William Harriston
(74) *Attorney, Agent, or Firm* — Slater Matsil, LLP

(57) ABSTRACT

A semiconductor device comprises a substrate, a die mounted on the substrate, a reinforcement plate bonded to the die, and an adhesive layer coupling the reinforcement plate to the die.

19 Claims, 1 Drawing Sheet

(56) References Cited

U.S. PATENT DOCUMENTS

2010/0230797 A1 9/2010 Honda
2011/0304045 A1 12/2011 Liu et al.
2011/0309491 A1 12/2011 Thorne et al.

* cited by examiner

US 9,806,038 B2

REINFORCEMENT STRUCTURE AND METHOD FOR CONTROLLING WARPAGE OF CHIP MOUNTED ON SUBSTRATE

PRIORITY

This application claims the benefit to and is a divisional of U.S. patent application Ser. No. 13/791,411, filed on Mar. 8, 2013, and entitled "Reinforcement Structure and Method for Controlling Warpage of Chip Mounted on Substrate," which application is incorporated herein by reference.

BACKGROUND

The semiconductor integrated circuit (IC) industry has experienced rapid growth. Technological advances in IC materials and designs have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (e.g., the number of interconnected devices per chip area) has generally increased while geometry size (e.g., the smallest component that can be created using a fabrication process) has decreased. As geometry size gets smaller, the packaging process of ICs becomes more challenging.

One of the current packaging processes employs "flip chip" technology, where a chip is flipped and bonded with a carrier substrate in a post-SMT (surface mount) process. Temperature fluctuations in existing flip chip bonding processes may result in excessive thermal stress, which may then lead to warping of the chip package. FIG. 1 shows a semiconductor device having a die 120 mounted onto a substrate 110 and the semiconductor device undergoing warpage due to CTE (coefficient of thermal expansion) mismatch between the die 120 and the substrate 110. As the die 120 and the substrate 110 undergo temperature changes during the flip chip bonding process, the die 120 and the substrate 110 will contract at rates that are dependent on their respective coefficients of thermal expansion. Often times, there is a mismatch between the CTE of the die 120 and the CTE of the substrate 110. This mismatch of the CTE means that the die 120 and the substrate 110 are contracting at different rates, which causes stress between the die 120 and the substrate 110.

In one example, due to the large mismatch in CTE between a chip and a flexible substrate, which can be mostly composed of polyimide and copper layers, the warpage of the die can be as large as 100 µm. Such large warpage can exceed the surface flatness requirements (e.g., 20-30 µm) required by many sensor application systems such as optical and capacitance-type fingerprint recognition systems.

Although the post-SMT die warpage can be effectively reduced by simply increasing the die thickness, the total package stack-up height constraint, which is virtually adopted by all applications using flexible substrate, makes this not a viable option.

BRIEF DESCRIPTION OF DRAWINGS

Embodiments of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

In the following description, specific details are set forth to provide a thorough understanding of embodiments of the present disclosure. However, one having ordinary skill in the art will recognize that embodiments of the disclosure can be practiced without these specific details. In some instances, well-known structures and processes are not described in detail to avoid unnecessarily obscuring embodiments of the present disclosure.

Reference throughout this specification to "one embodiment" or "an embodiment" means that a particular feature, structure, or characteristic described in connection with the embodiment is included in at least one embodiment of the present disclosure. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are intended for illustration.

Figure 1:
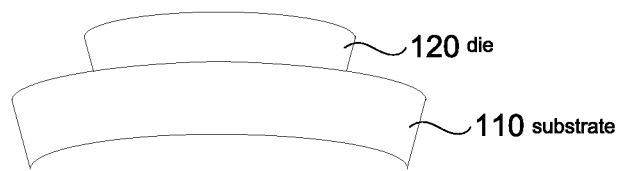
FIG. 1 is a side view of a semiconductor device having a die mounted onto a substrate and the semiconductor device undergoing warpage due to CTE mismatch between the die and the substrate.
Figure 2:
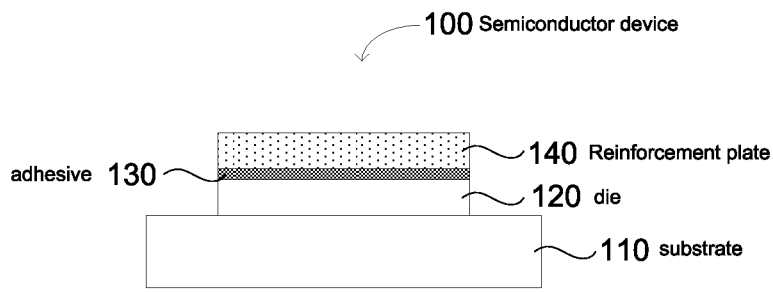
FIGS. 2-4 are cross-sectional views of a semiconductor device in accordance with various embodiments of the present disclosure.
Figure 3:
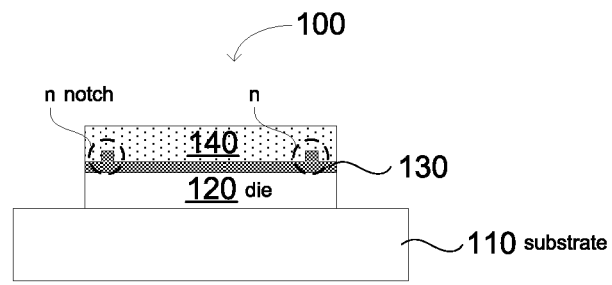
Figure 4:
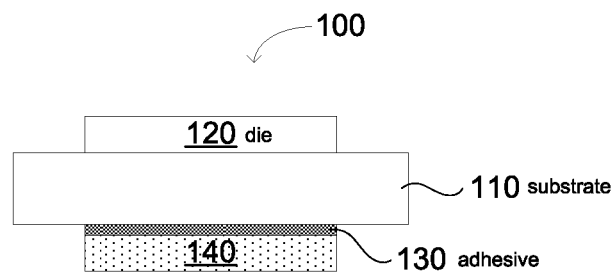

FIGS. 2-4 are cross-sectional views of a semiconductor device according to various embodiments of the present disclosure. It is understood that FIGS. 2-4 have been simplified for a better understanding of the inventive concepts of the present disclosure. It should be appreciated that the materials, geometries, dimensions, structures, and process parameters described herein are exemplary only, and are not intended to be, and should not be construed to be, limiting to the invention claimed herein. Many alternatives and modifications will be apparent to those skilled in the art, once informed by the present disclosure.

Referring to FIG. 2, a semiconductor device 100 (which can alternatively be referred to as a package) is provided. The semiconductor device 100 includes a die 120 (also referred to as a chip). The die 120 may be an integrated circuit (IC) chip, system on chip (SoC), or portion thereof, that may include various passive and active microelectronic devices (not shown) such as resistors, capacitors, inductors, diodes, metal-oxide semiconductor field effect (MOSFET) transistors, complementary metal-oxide semiconductor (CMOS) transistors, bipolar junction transistors (BJTs), laterally diffused MOS (LDMOS) transistors, high power MOS transistors, other types of transistors, or other types of devices. The die 120 may comprise a memory device, a logic device, or other types of circuits, as examples. In the depicted embodiment, the die 120 is "flipped" upside down and bonded to a carrier substrate or substrate 110. The substrate 110 can be, for example, a silicon substrate, a plastic substrate, a flexible substrate having polyimide and copper layers for example, a laminate substrate, a ceramic substrate, an interposer, or any other suitable support structure.

An active surface of the die 120 is electrically coupled with a surface of the substrate 110. The die 120 is bonded to the substrate 110 by any suitable mechanism. For example, the die 120 may include an interconnect structure (not illustrated) and bonding pads over the interconnect structure, and solder balls or solder bumps may be formed on the bonding pads, respectively. The solder balls may be aligned with and come into contact with bonding pads on the substrate 110, thereby producing electrical coupling between the die 120 and the substrate 110.

In accordance with an aspect of the present disclosure, in order to reduce and/or prevent warpage caused by the CTE mismatch between the die 120 and the carrier substrate 110, a reinforcement structure or a reinforcement plate 140 is bonded to the die 120 by an adhesive layer 130. In an exemplary embodiment, the reinforcement plate 140 comprises a glass material, such as borosilicate glass, alumino-silicate glass, alkali-barium silicate glass, or quartz, as examples. The reinforcement plate 140 may comprise a primary component of $SiO_2$ with one or more elements included to achieve a desired characteristic for the glass in some embodiments, for example. The reinforcement plate 140 may include a single glass layer or a plurality of glass layers. In some other embodiments, the reinforcement plate 140 includes metal, such as for example copper or stainless steel, ceramic, plastic, or other suitable materials. The reinforcement plate 140 may comprise a single layer or a laminate layer. The reinforcement plate 140 has a thickness of about 50 μm to about 250 μm in some embodiments.

The reinforcement plate 140 is coupled to the die 120 by a gluing process, a thermal bonding process, a pressure bonding process, a combination thereof in accordance with some embodiments, or other types of bonding processes. In a gluing process, the reinforcement plate 140 is bonded to the die 120 by the adhesive layer 130, which may include a glue, tape, UV tape, an optically transparent UV tape, or some other suitable adhesive, as examples. The glue may comprise a material such as benzocyclobutene (BCB) or SU-8, which may include epoxy resin, gamma butyrolactone, and triaryl sulfonium salt), as examples, although alternatively, other materials may be used. In an exemplary embodiment, the adhesive layer 130 is applied peripherally onto the die 120. Turning now to FIG. 3, the reinforcement plate 140 has an indentation or notch n proximate the corners thereof for receiving the adhesive layer 130, according to another aspect of the present invention. A function of the indentation or notch n is to confine the adhesive layer 130 to the peripheral areas of the die 120 and to assist the reinforcement plate 140 to better bond to the die 120. This is because the adhesive layer 130 contacts the notches n in the reinforcement plate 140 in addition o the surfaces of the reinforcement plate 140 and the die 120. The illustrated notch n is not intended to be limiting as the notch n can have any contemplated shape, size or depth. Further, although two notches are shown, any number and/or placement of notches is contemplated. In some embodiments, the notch n is in the form of a ring. In some other embodiments, the notch n has discrete indentations or grooves in the reinforcement plate 140.

FIG. 4 is a cross-sectional view of the semiconductor device 100 in accordance with another embodiment of the present disclosure. In this embodiment, the reinforcement plate 140 is bonded to the substrate 110 by an adhesive layer 130. In an exemplary embodiment, the reinforcement plate 140 comprises a glass material, such as borosilicate glass, alumino-silicate glass, alkali-barium silicate glass, or quartz, as examples. The reinforcement plate 140 may comprise a primary component of $SiO_2$ with one or more elements included to achieve a desired characteristic for the glass in some embodiments, for example. The reinforcement plate 140 may include a single glass layer or a plurality of glass layers. In some other embodiments, the reinforcement plate 140 includes metal, such as for example copper or stainless steel, ceramic, plastic, or other suitable materials. The reinforcement plate 140 may comprise a single layer or a laminate layer. The reinforcement plate 140 has a thickness of about 50 μm to about 250 μm in some embodiments.

The reinforcement plate 140 is coupled to the substrate 110 by a gluing process, a thermal bonding process, a pressure bonding process, a combination thereof in accordance with some embodiments, or other types of bonding processes. In a gluing process, the reinforcement plate 140 is bonded to the substrate 110 by the adhesive layer 130, which may include a glue, tape, or some other suitable adhesive, as examples. The glue may comprise a material such as benzocyclobutene (BCB) or SU-8, which may include epoxy resin, gamma butyrolactone, and triaryl sulfonium salt), as examples, although alternatively, other materials may be used.

The present disclosure provides a reinforcement structure that can reinforce and reduce warpage of flip-chip packages, especially those in a post-SMT (surface mount) process. For example, compared to conventional packages, the disclosed packages including the carrier substrate having a reinforcement plate have been observed to reduce package warpage by about 80%. The disclosed reinforcement plate thus improves mechanical and/or thermal performance of flip-chip packages. Different embodiments may have different advantages, and no particular advantage is necessarily required of any embodiment.

The present disclosure has described various exemplary embodiments. According to one embodiment, a semiconductor device comprises a substrate, a die mounted on the substrate, a reinforcement plate bonded to the die, and an adhesive layer coupling the reinforcement plate to the die.

According to another embodiment, a semiconductor device comprises a substrate, a die mounted on the substrate, a reinforcement plate bonded to the substrate, and an adhesive layer coupling the reinforcement plate to the substrate.

According to yet another embodiment, a method of packaging a semiconductor device comprises bonding a die to a substrate, and bonding a reinforcement plate to the die wherein the reinforcement plate is bonded to the die by an adhesive layer.

According to another embodiment, a semiconductor device includes a substrate, a die mounted on the substrate, a reinforcement plate having a periphery and a center region, the reinforcement plate being continuous from a top leftmost corner of the periphery to a bottom rightmost corner of the periphery through the center region, and an adhesive layer bonding the reinforcement plate to the die.

According to yet another embodiment, a package includes a die having an active surface, the active surface being electrically coupled with a surface of a substrate, and a reinforcement plate adhered to the die with an adhesive, the reinforcement plate comprising a metal and having a periphery and a center region, the reinforcement plate being continuous from a top rightmost corner of the periphery to a bottom leftmost corner of the periphery through the center region.

According to yet another embodiment, a semiconductor device includes a die having a first surface and a second surface opposite the first surface. A substrate is coupled to the first surface of the die. A reinforcement plate, wherein the reinforcement plate is coupled to the second surface of the die, has a border region and a center region, has a first thickness in the center region, and is continuous from a top leftmost corner of the border region to a bottom rightmost corner of the border region through the center region.

In the preceding detailed description, specific exemplary embodiments have been described. It will, however, be apparent to a person of ordinary skill in the art that various modifications, structures, processes, and changes may be made thereto without departing from the broader spirit and scope of the present disclosure. The specification and drawings are, accordingly, to be regarded as illustrative and not restrictive. It is understood that embodiments of the present disclosure are capable of using various other combinations and environments and are capable of changes or modifications within the scope of the claims.

What is claimed is:

1. A semiconductor device, comprising:
    a substrate;
    a die mounted on the substrate, the die having a rightmost edge and a leftmost edge, the substrate extending unbroken below the die from the rightmost edge to the leftmost edge of the die;
    a reinforcement plate having a periphery and a center region, the reinforcement plate being continuous from a top leftmost corner of the periphery to a bottom rightmost corner of the periphery through the center region; and
    an adhesive layer bonding the reinforcement plate to the die, the die being interposed between the substrate and the reinforcement plate.

2. The semiconductor device of claim 1, wherein the substrate is a flexible substrate.

3. The semiconductor device of claim 1, wherein the reinforcement plate includes glass.

4. The semiconductor device of claim 1, wherein the reinforcement plate includes metal.

5. The semiconductor device of claim 1, wherein the reinforcement plate includes ceramic.

6. The semiconductor device of claim 1, wherein the reinforcement plate has a thickness from about 50 µm to about 250 µm.

7. The semiconductor device of claim 1, wherein the reinforcement plate has at least one notch for receiving the adhesive layer.

8. The semiconductor device of claim 1, wherein the adhesive layer includes glue or tape.

9. A package comprising:
    a die having an active surface, the active surface being electrically coupled with a surface of a substrate; and
    a reinforcement plate adhered to the die with an adhesive, the reinforcement plate comprising a metal and having a periphery and a center region, the reinforcement plate being continuous from a top rightmost corner of the periphery to a bottom leftmost corner of the periphery through the center region, and the reinforcement plate comprising a notch proximate corners of the reinforcement plate, the notch configured to receive the adhesive.

10. The package of claim 9, wherein the substrate is a silicon substrate, a plastic substrate, a flexible substrate, a laminate substrate, a ceramic substrate, or an interposer.

11. The package of claim 9, wherein the substrate is a flexible substrate having polyimide and copper layers.

12. The package of claim 9, wherein the notch is configured to confine the adhesive to peripheral areas of the die.

13. The package of claim 9, wherein the notch is in the form of a ring.

14. A semiconductor device, comprising:
    a die having a bottommost surface and a topmost surface opposite the bottommost surface;
    a substrate coupled to the bottommost surface of the die;
    a reinforcement plate, wherein the reinforcement plate:
        has a bottommost surface coupled to the topmost surface of the die, the bottommost surface of the reinforcement plate being above the topmost surface of the die;
        has a border region and a center region;
        has a first thickness in the center region; and
        is continuous from a top leftmost corner of the border region to a bottom rightmost corner of the border region through the center region; and
    an adhesive layer coupling the reinforcement plate to the topmost surface of the die.

15. The semiconductor device of claim 14, wherein the adhesive layer is a material selected from the group consisting essentially of glue, tape, UV tape, an optically transparent UV tape, and combinations thereof.

16. The semiconductor device of claim 14, wherein the adhesive layer is a material selected from the group consisting essentially of benzocyclobutene (BCB) and SU-8.

17. The semiconductor device of claim 14, wherein the reinforcement plate further comprises a notch in the border region of the reinforcement plate facing the topmost surface of the die, the notch having a second thickness less than the first thickness.

18. The semiconductor device of claim 14, wherein the reinforcement plate comprises a material selected from the group consisting essentially of glass, metal, and ceramic.

19. The semiconductor device of claim 14, wherein the die has a central region, and wherein the substrate is coupled to the bottommost surface of the die in the central region of the die.

* * * * *